United States Patent [19]

Lang

[11] Patent Number: 5,633,592
[45] Date of Patent: May 27, 1997

[54] CHARGE STATUS INDICATOR

[75] Inventor: Gerhard Lang, Altweilnau, Germany

[73] Assignee: Braun Aktiengesellschaft, Kronberg, Germany

[21] Appl. No.: 448,387
[22] PCT Filed: Nov. 9, 1993
[86] PCT No.: PCT/EP93/03135
§ 371 Date: Jun. 6, 1995
§ 102(e) Date: Jun. 6, 1995
[87] PCT Pub. No.: WO94/14079
PCT Pub. Date: Jun. 23, 1994

[30] Foreign Application Priority Data

Dec. 12, 1992 [DE] Germany ............ 42 41 975.1

[51] Int. Cl.⁶ .................... G01R 31/36; G01R 13/40
[52] U.S. Cl. .................... 324/433; 320/48; 340/636; 324/426
[58] Field of Search .................... 324/426, 433, 324/432, 425; 320/48; 340/636

[56] References Cited

U.S. PATENT DOCUMENTS

| | | | |
|---|---|---|---|
| 3,927,399 | 12/1975 | Fuzzell | 340/248 |
| 3,979,657 | 9/1976 | Yorksie | 320/13 |
| 4,017,724 | 4/1977 | Finger | 235/151.31 |
| 4,193,026 | 3/1980 | Finger et al. | 324/428 |
| 4,755,816 | 7/1988 | DeLuca | 340/825.44 |
| 5,130,659 | 7/1992 | Sloan | 324/435 |
| 5,130,699 | 7/1992 | Reher et al. | 340/661 |
| 5,237,257 | 8/1993 | Johnson et al. | 320/2 |
| 5,442,345 | 8/1995 | Kwon | 340/825.46 |

FOREIGN PATENT DOCUMENTS 0 252 309   6/1987   European Pat. Off. .

OTHER PUBLICATIONS

McGowan, "IC Timer Automatically Monitors Battery Voltage," Electronics, 130–131 (1973).
Swager, "Monitor Circuit Conserves Battery Energy," Design Ideas, 35:151 (1990).
2421 Radio Fernsehen Eletronik, vol. 32 (1983).
Elektronische Batterie–Ladezustandskontrolle, Bastel–Ecke (1974).
Batteriespannungswächter mit niedrigem Stromverbrauch, (1978).
Rubenstein, "Low Battery Threshold Detector Draws Only 2µA of Standby Current," Electronic Design, 28:156 (1980).
Überwachung, et al., "Akkuspanungs–Indikator," Elektor 4:44–445 (1980).

Primary Examiner—Sandra L. O'Shea
Assistant Examiner—Raymond Y. Mah
Attorney, Agent, or Firm—Fish & Richardson, P.C.

[57] ABSTRACT

A circuit arrangement for indicating the charge status of a batter in an electrical appliance includes a voltage comparator with hysteresis which detects the battery voltage, an oscillator driven by the voltage comparator, and an indicating device. The oscillator oscillates when the voltage is above a first threshold voltage and switches the indicating device to an active condition. The oscillator is blocked when the voltage is below a second threshold voltage and switches the indicated device to a passive condition.

10 Claims, 2 Drawing Sheets

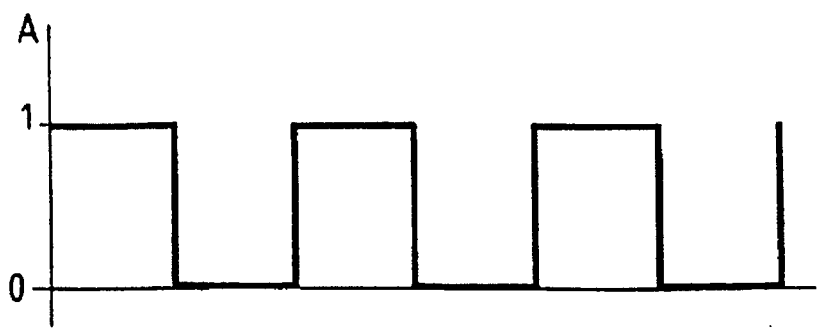
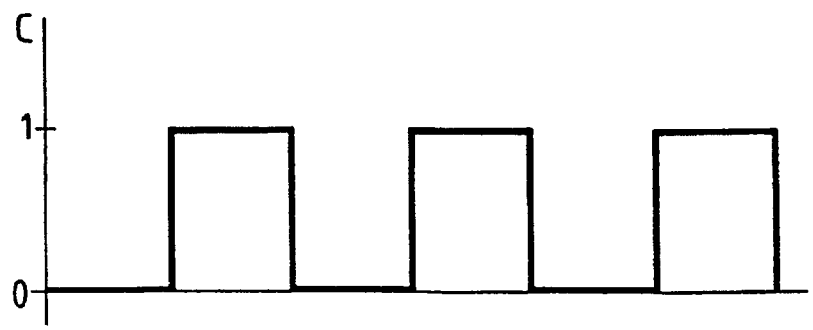
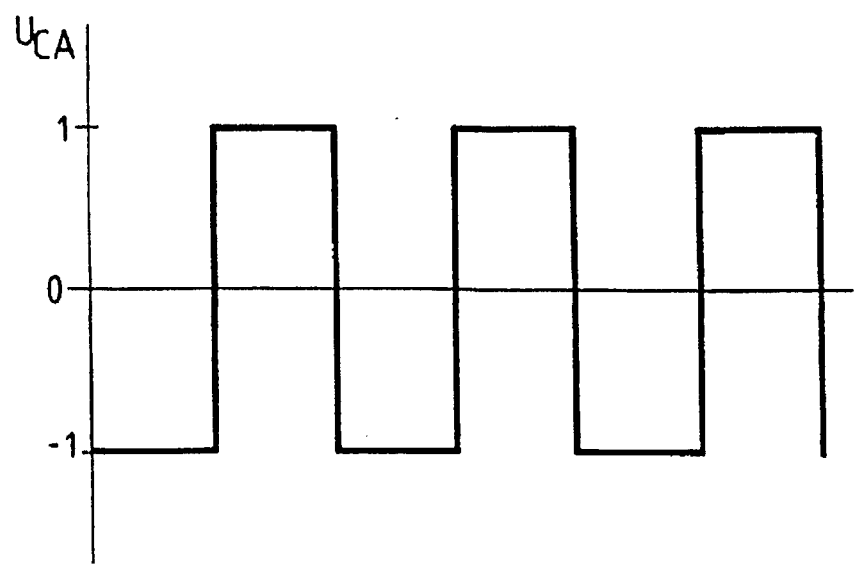

CHARGE STATUS INDICATOR

BACKGROUND OF THE INVENTION

This invention relates to a circuit arrangement for a charge status indicator of a primary battery or a secondary battery (rechargeable accumulator) in an electrical appliance as, for example, a battery-powered shaving apparatus.

Voltage-dependent battery monitoring devices are known in the art which detect the charge status of the battery during operation of the appliance in one or several stages, indicating the charge status permanently or intermittently and/or providing an information of a specified charge status after the appliance is turned off.

Indicating devices which indicate the charge status permanently in several stages after the appliance is turned off require high technical complexity (microcontroller) and are accordingly expensive. On the other hand, inexpensive indicators draw such a high current that a permanent indication after the appliance is turned off is possible for only a short period because its drain on the battery.

Further, from the journal EDN—Electrical Design News, Vol. 35 (1990), Aug. 20, No. 17, Newton, Mass., US, page 151, an indicating device is known in which the battery voltage is applied to a voltage divider, and a voltage tapped in this voltage divider is fed to a microcontroller input. This microcontroller receives further voltage values to provide a comparator with a hysteresis, as well as an external oscillation frequency intended to operate, where applicable, a light-emitting diode serving as an indicating device. This indicating device is rendered active when the battery voltage has dropped to a critical value. In this prior art, the power consumption of the indicating device is lowered by operating the indicating device intermittently with the external oscillation frequency.

It is an object of the present invention to provide a circuit arrangement for a charge status indicator which is of a straightforward and inexpensive construction and draws such a low current that its connection to the battery can be always maintained also after the appliance is turned off.

SUMMARY OF THE INVENTION

This object is accomplished by a circuit arrangement for indicating the charge status of a battery in an electrical appliance, in which the circuit arrangement includes a voltage comparator with hysteresis for detecting the battery voltage, as well as an oscillator driven by the voltage comparator, and an indicating device. The oscillator oscillates when the voltage is above a first threshold voltage and switches the indicating device to an active condition. The oscillator is blocked when the voltage is below a second threshold voltage and switches the indicating device to the passive condition, with the absolute value of the first threshold voltage being greater than the absolute value of the second threshold voltage.

Particularly advantageously, such an arrangement can be used in a liquid crystal display (LCD) serving as indicating device on which a symbol is printed which is visible in the passive condition of the indicating device, signaling to the user that the accumulator (secondary battery) need to be recharged or that the battery (primary battery) need to be replaced.

Further advantageous embodiments are indicated in the subclaims and the description.

An embodiment of the present invention will be described in more detail in the following with reference to the accompanying drawings. In the drawings,

BRIEF DESCRIPTION OF THE DRAWINGS

FIG. 3 shows signal waveforms in the circuit arrangement of FIG. 1.

DESCRIPTION OF THE PREFERRED EMBODIMENT

Figure 1:
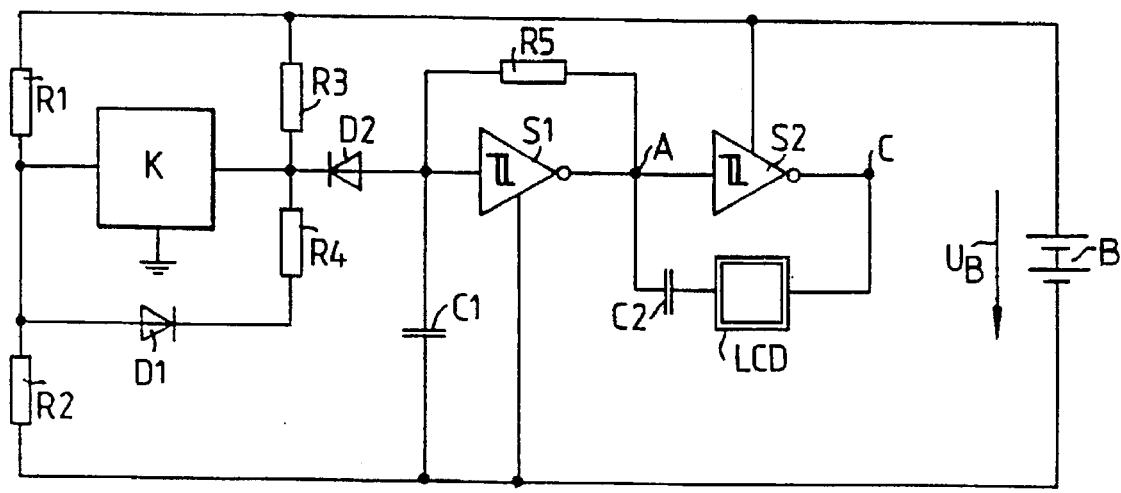
FIG. 1 shows an embodiment of the present invention.

In FIG. 1, the input of a voltage comparator K is applied to the junction of a voltage divider comprised of two resistors R1/R2 connected in parallel to a battery B. This battery B is, for example, a two-cell accumulator of an electric shaving apparatus. The comparator K is a commercially available component (voltage detector), comprising a Schmitt-Trigger with reference voltage and an output driver. The voltage divider R1/R2 divides the battery voltage UB down to a value adapted to the comparator K. The output of the comparator K is connected to the positive pole of the battery B through a resistor R3, to the input of an oscillator through a decoupling diode D2, and fed back to its input through the series arrangement formed from a resistor R4 and a diode D1.

The oscillator is comprised of a Schmitt-Trigger S1 with inverting output, a resistor R5 inserted between the output and the input of the Schmitt-Trigger S1, and a capacitor C1 connected between the input and reference potential (negative pole of the battery B).

The output A of the oscillator is connected to the first terminal of an indicating device which in this embodiment is a liquid crystal display (LCD), and to the second terminal of the LCD device through a Schmitt-Trigger S2 with inverting output. The capacitor C2 serially connected to a terminal of the LCD device serves to decouple the inadmissibly high dc voltage present in the passive condition of the LCD.

The battery voltage UB of a two-cell accumulator is between 2.7 and 2.8 volts, approximately, when the battery is fully charged. As long as the battery voltage UB is above a first threshold voltage UB1, for example, 2.5 volts, the battery B is in a charge status referred to as "sufficient capacity available". When the battery voltage UB drops to a lower, second threshold voltage UB2, for example, 2.3 volts, which is referred to as a "low charge", this means that the battery is discharged to 10 to 20% of its capacity. It is of particular advantage to alert the user that the voltage has dropped below this "low charge" condition.

Above the first threshold voltage UB1, the output of the comparator K is a "high" level (positive potential), and the oscillator comprised of the Schmitt-Trigger S1, resistor R5 and capacitor C1 oscillates. The signal shown in FIG. 3a is present at its output A, while the signal shown in FIG. 3b is present at the output C of the Schmitt-Trigger S2. The LCD device is thus driven with the ac voltage illustrated in FIG. 3c, being thus, switched to the active condition.

When the battery voltage UB drops below the second threshold voltage UB2 (2.3 volts), the output of the comparator K goes from a "high" to a "low" level (reference potential), the oscillator is blocked, and the dc voltage UB is present at its output A. Zero potential ("low"=reference potential) resides at the output C of the Schmitt-Trigger S2. In the absence of capacitor C2, battery voltage would be present at the LCD device, involving the risk of destroying the LCD. To eliminate this risk, capacitor C2 is inserted which lowers the dc voltage at the LCD to a permissible amount through the capacitive divider thus formed. The capacitance of C2 is determined as follows:

$$C2 = \frac{UB}{ULCD} \cdot CLCD,$$

where C2 is the capacitance of the series capacitor, UB is the battery voltage, ULCD is the permitted static dc voltage at the LCD, and CLCD is the capacitance of the LCD surface.

Figure 2:
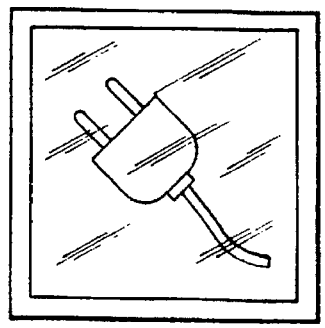
FIG. 2 shows, by way of example, an imprint on a liquid crystal display which is visible in the passive condition.

The LCD is in its passive condition, and the plug symbol printed on the LCD and shown in FIG. 2 by way of example becomes visible, alerting the user that the battery is in need of recharging or replacement.

As the battery B is recharged, the hysteresis produced by means of resistor R4 and diode D1 causes the comparator K to switch to its other condition not until the battery voltage UB has reached the upper, first threshold voltage UB1 (2.5 volts). It is thereby ensured that the LCD device is not allowed to resume its active condition—in which the plug symbol shown in FIG. 2 is no longer visible—until the battery B is charged to a level in which sufficient capacity is again available.

By virtue of its very low power consumption, this arrangement can remain connected to the battery permanently under all operating conditions of the appliance (also when it is turned off), thus enabling the user to be at all times informed of the charge status of the battery.

What is claimed:

1. A circuit arrangement for indicating the charge status of a battery in an electrical appliance comprising:

a voltage comparator with hysteresis for detecting a battery voltage of the battery, an indicating device having a symbol printed thereon, the indicating device switched to an active condition when the voltage is above a first threshold voltage, the indicating device switched to a passive condition when the voltage is below a second threshold voltage with the absolute value of the first threshold voltage being greater than the absolute value of the second threshold voltage, the symbol being visible only when the indicating device is in the passive condition.

2. The circuit arrangement as claimed in claim 1, further comprising a first resistor and a voltage divider including a second resistor and third resistor in parallel with the battery, wherein the input of the voltage comparator is applied to the junction of the second resistor and third resistor and the output of the voltage comparator is connected to a pole of the battery through the first resistor.

3. The circuit arrangement as claimed in claim 1, further comprising a series arrangement of a fourth resistor and a first diode, said series arrangement connected between an output of the voltage comparator and an input of the voltage comparator, wherein the series arrangement provides the hysteresis of the voltage comparator.

4. The circuit arrangement as claimed in claim 1, further comprising an oscillator connected between the comparator and the indicating device, wherein the oscillator includes a first Schmitt-Trigger with an inverting output, a feedback resistor connected between an output and an input of the first Schmitt-Trigger, and a first capacitor connected between the input of the first Schmitt-Trigger and a pole of the battery at a reference potential.

5. The circuit arrangement as claimed in claim 1 further comprising an oscillator connected between the comparator and the indicating device and a Schmitt-Trigger with an inverting output, wherein the indicating device includes first and second terminals and the output of the oscillator is applied to the first terminal of the indicating device, through the Schmitt-Trigger and to the second terminal of the indicating device.

6. The circuit arrangement as claimed in claim 1, further comprising an oscillator connected between the comparator and the indicating device and a diode, wherein the output of the voltage comparator and the input of the oscillator are decoupled from each other through the diode.

7. The circuit arrangement as claimed in claim 1, wherein the indicating device is a liquid crystal display device.

8. The circuit arrangement as claimed in claim 7, further comprising a capacitor connected in series with a terminal of the indicating device.

9. The circuit arrangement as claimed in claim 1, wherein the battery is maintained in connection within the circuit arrangement even after the appliance is turned off.

10. The circuit arrangement as claimed in claim 4 further comprising a second Schmitt-Trigger with an inverting output and wherein the indicating device includes first and second terminals and the output of the oscillator is applied to the first terminal of the indicating device, through the second Schmitt-Trigger and to the second terminal of the indicating device.

* * * * *